(12) United States Patent
Nurmi et al.

(10) Patent No.: US 7,834,640 B2
(45) Date of Patent: Nov. 16, 2010

(54) SYSTEM AND METHOD FOR TESTING ELECTRICAL CONNECTION

(75) Inventors: Juha Harri-Pekka Nurmi, Salo (FI); Jussi Petteri Koskela, Kaarina (FI)

(73) Assignee: Nokia Corporation, Espoo (FI)

( * ) Notice: Subject to any disclaimer, the term of this patent is extended or adjusted under 35 U.S.C. 154(b) by 429 days.

(21) Appl. No.: 11/904,385

(22) Filed: Sep. 26, 2007

(65) Prior Publication Data
US 2009/0079438 A1 Mar. 26, 2009

(51) Int. Cl.
G01R 31/04 (2006.01)
G01R 31/02 (2006.01)

(52) U.S. Cl. ........................................ 324/538; 324/763

(58) Field of Classification Search .................. 324/538, 324/537, 500, 66, 76.11, 512, 519, 523, 527, 324/763, 765, 536, 555, 756
See application file for complete search history.

(56) References Cited

U.S. PATENT DOCUMENTS

| 5,083,117 A | * | 1/1992 | Hoigaard | .................... 340/649 |
| 5,781,024 A | * | 7/1998 | Blomberg et al. | ............ 324/763 |
| 2006/0183470 A1 | | 8/2006 | Koivukangas et al. | |
| 2006/0273820 A1 | | 12/2006 | Arnold et al. | |
| 2009/0079457 A1 | * | 3/2009 | Cheng et al. | ................. 324/763 |

* cited by examiner

Primary Examiner—Hoai-An D Nguyen
(74) Attorney, Agent, or Firm—Harrington & Smith

(57) ABSTRACT

An electrical connection testing system for testing existence of an electrical connection between a first electronic device and a second electronic device. An electrostatic discharge (ESD) protection circuit is provided between the first and second electronic devices. The testing system includes a comparator having a first input connected to a power for output of the first electronic device and a second input connected to an output signal from the first electronic device. The output signal is adapted to be sent to the second electronic device through the ESD protection circuit. The testing system also includes a system for determining if a comparator output from the comparator is indicative of the first and second inputs being different or if the comparator output is indicative of the first and second inputs being substantially the same.

22 Claims, 7 Drawing Sheets

INTERNAL CONNECTION

EXTERNAL CONNECTION

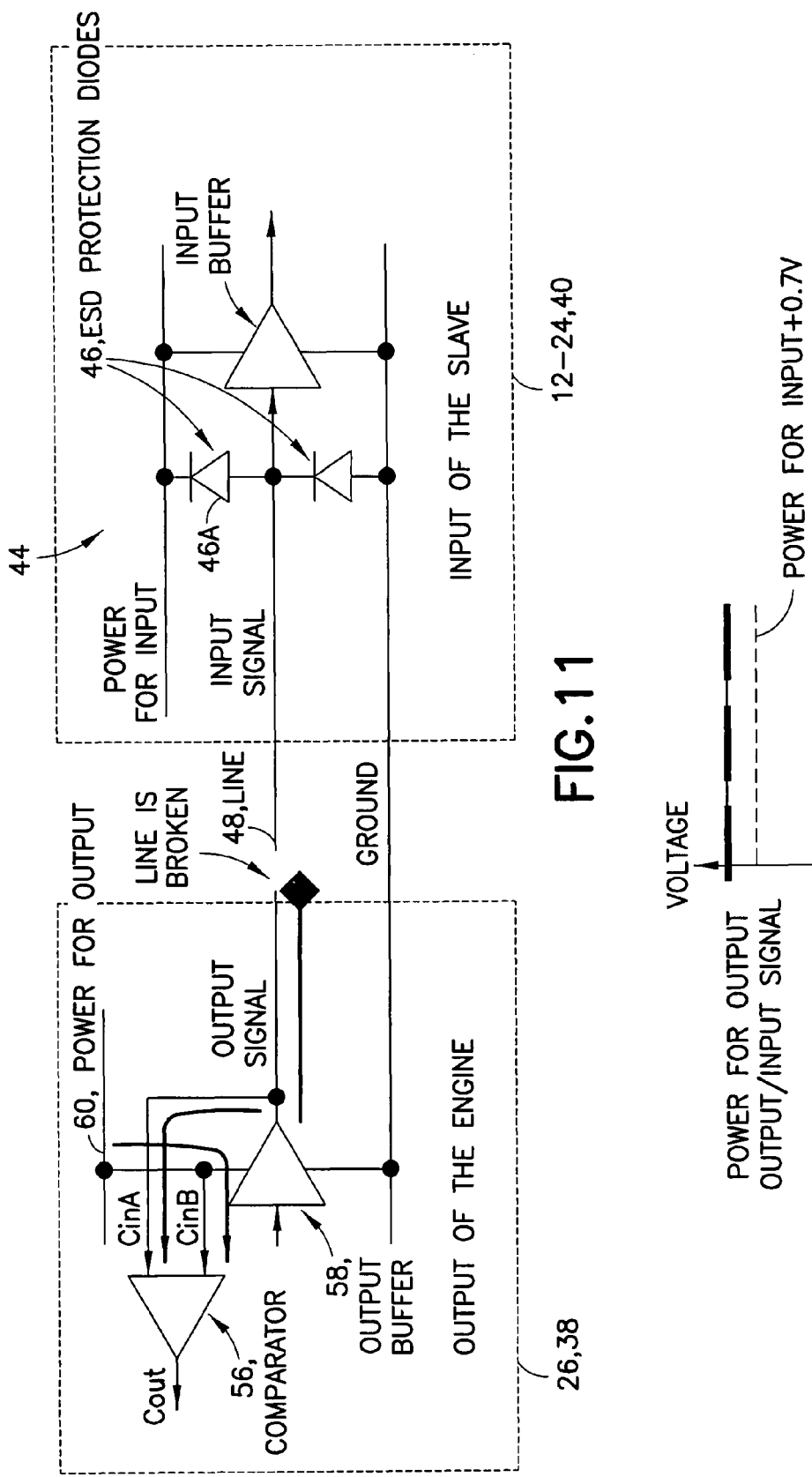

SYSTEM AND METHOD FOR TESTING ELECTRICAL CONNECTION

BACKGROUND OF THE INVENTION

1. Field of the Invention

The invention relates to a connection between electronic devices and, more particularly, to a system for testing if the connection exists.

2. Brief Description of Prior Developments

In most portable electronic devices, such as a mobile telephone for example, an electrostatic discharge (ESD) circuit is mandatory in pin electronics. Manufacturers and users of integrated circuits must take precautions to avoid electrostatic discharge. A simple and common solution to protect again electrostatic discharge is by using diodes, which can detect and clip the input voltage if the voltage is out of acceptable input voltage levels.

A conventional line connection test always needs some kind of logic on the slave device when bidirectional communication is used on the same line. A conventional line connection test always needs some kind of logic on the slave device, and a parallel processor bus between the engine and the slave device to get this information. This means that there is needed several different solutions to test a single line connection.

U.S. Patent Application Publication No. 2006/0183470 A1 discloses a method and arrangement of testing a device in a mobile station. U.S. Patent Application Publication No. 2006/0273820 A1 discloses an integrated circuit having an input and output circuit and a method for testing.

SUMMARY OF THE INVENTION

In accordance with one aspect of the invention, an electrical connection testing system is provided for testing existence of an electrical connection between a first electronic device and a second electronic device. An electrostatic discharge (ESD) protection circuit is provided between the first and second electronic devices. The testing system includes a comparator having a first input connected to a power for output of the first electronic device and a second input connected to an output signal from the first electronic device. The output signal is adapted to be sent to the second electronic device through the ESD protection circuit. The testing system also includes a system for determining if a comparator output from the comparator is indicative of the first and second inputs being different or if the comparator output is indicative of the first and second inputs being substantially the same.

In accordance with another aspect of the invention, an apparatus is provided comprising a first electronic device forming an engine; a second electronic device forming a slave; an electrical conductor connecting the first electronic device to the second electronic device; an electrostatic discharge (ESD) protection circuit comprising diodes connected between the conductor and the second electronic device; a comparator having a first input connected to a power for output of the first electronic device and a second input connected to an output signal from the first electronic device to the conductor; and a system for determining if the first and second electrical devices are connected to each other by the conductor based upon a comparator output of the comparator.

In accordance with another aspect of the invention, a method is provided comprising sending an output signal, powered by a power for output at an excessive voltage, from a first electronic device to a second electronic device, wherein an electrostatic discharge (ESD) protection circuit is provided at the second electronic device, wherein the excessive voltage of the power for output is larger than a threshold voltage of the ESD protection circuit, and wherein the ESD protection circuit prevents voltage of the output signal from exceeding the threshold voltage of the ESD protection circuit; and comparing the voltage of the output signal of the first electronic device to the excessive voltage of the power for output of the first electronic device to determine if the first and second electronic devices are electrically connected to each other through the ESD protection circuit.

In accordance with another aspect of the invention, a program storage device readable by a machine, tangibly embodying a program of instructions executable by the machine for performing operations to test an electrical connection between a first electronic device and a second electronic device, is provided the operations comprising based upon a comparison of voltage of an output signal, from the first electronic device to the second electronic device, to a voltage of a power for output of the first electronic device, determining if the first and second electronic devices are electrically connected to each other through an ESD protection circuit; and performing an operation if the step of determining determines that the first and second electronic devices are not electrically connected to each other through the ESD protection circuit.

BRIEF DESCRIPTION OF THE DRAWINGS

The foregoing aspects and other features of the invention are explained in the following description, taken in connection with the accompanying drawings, wherein:

FIG. 11 is a circuit diagram with the signal line between the two devices broken or disconnected;

FIG. 12 is a chart similar to FIG. 10 showing voltage of the power for output and the output signal for the condition shown in FIG. 11;

DETAILED DESCRIPTION OF THE PREFERRED EMBODIMENTS

Figure 1:
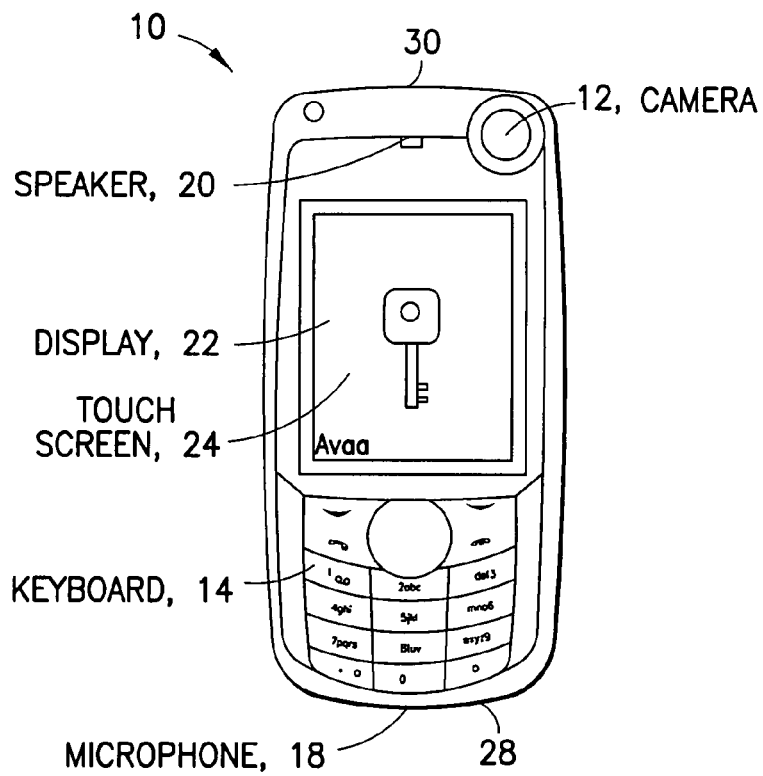
FIG. 1 is a front view of a hand-held portable device comprising features of the invention.

Referring to FIG. 1, there is shown a hand-held portable device 10 incorporating features of the invention. Although the invention will be described with reference to the exemplary embodiments shown in the drawings, it should be understood that the invention can be embodied in many alternate forms of, embodiments. In addition, any suitable size, shape or type of elements or materials could be used.

Figure 2:
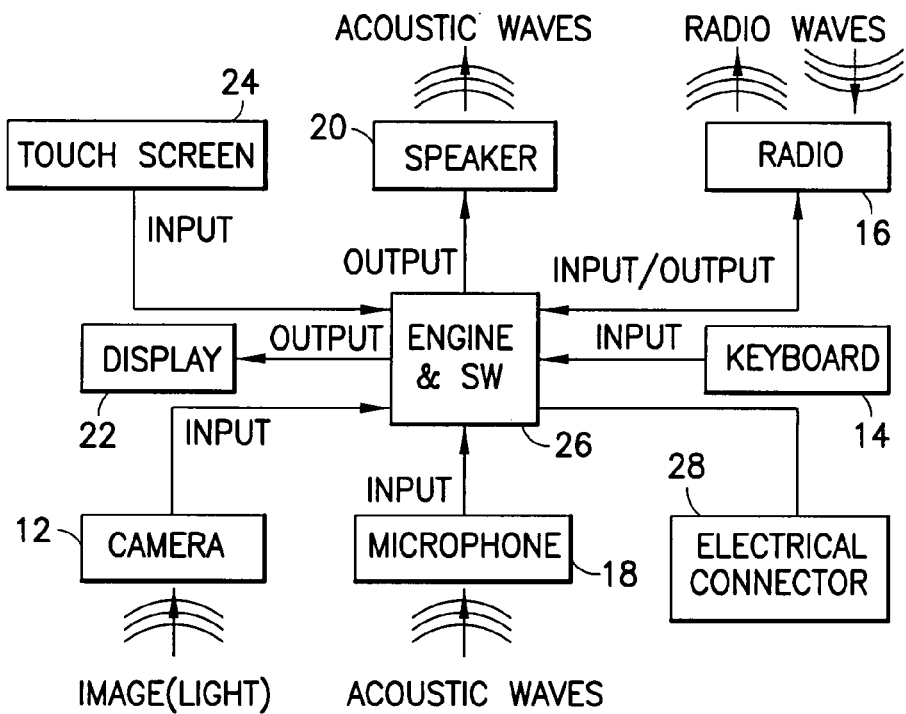
FIG. 2 is a block diagram of electronic components of the device shown in FIG. 1.

The hand-held portable device 10 can comprise a mobile telephone for example. However, features of the invention could be used in any suitable type of device(s) which have a electrostatic discharge (ESD) protection circuit or are connectable to a device having an ESD protection circuit. Referring also to FIG. 2, the mobile phone 10 can comprise electrical or electronic components such as, for example, a camera 12, a keyboard 14, a radio (transceiver) 16, a microphone 18, a speaker 20, a display 22, a touch screen 24, etc. The device 10 also comprises an engine 26, such as comprising a microprocessor and a memory 34 (see FIG. 3) on a printed wiring board 32. The device 10 also includes an electrical connector 28 for removably connecting the device 10 to another electronic device, such as a computer or slave device for example (see FIG. 4). The engine 26 can comprises suitable software as is known in the art. These are only some examples. Various alternative or additional components could be provided.

The microphone 18 is a component which is used for converting audio from acoustic waves to an electrical format. The speaker 20 is a component which is used for converting audio from electrical format to acoustic waves. The keyboard 14 is a component which is used for converting information from pressed keys to electrical signals. The radio part 16 is a component which is used for converting electrical information from/to radio waves. The display 22 is a component which is used for converting electrical information to a readable visual format. The touch screen 24 is a component which is used for converting physical touches to electrical format. The camera part 12 is a component which is used for converting an image, which is based on different levels of light from an object, into an electrical format. The engine 26 (with the software (SW)) is able to control these conversions as well as a user interface of the display, which is on the mobile device.

Figure 3:
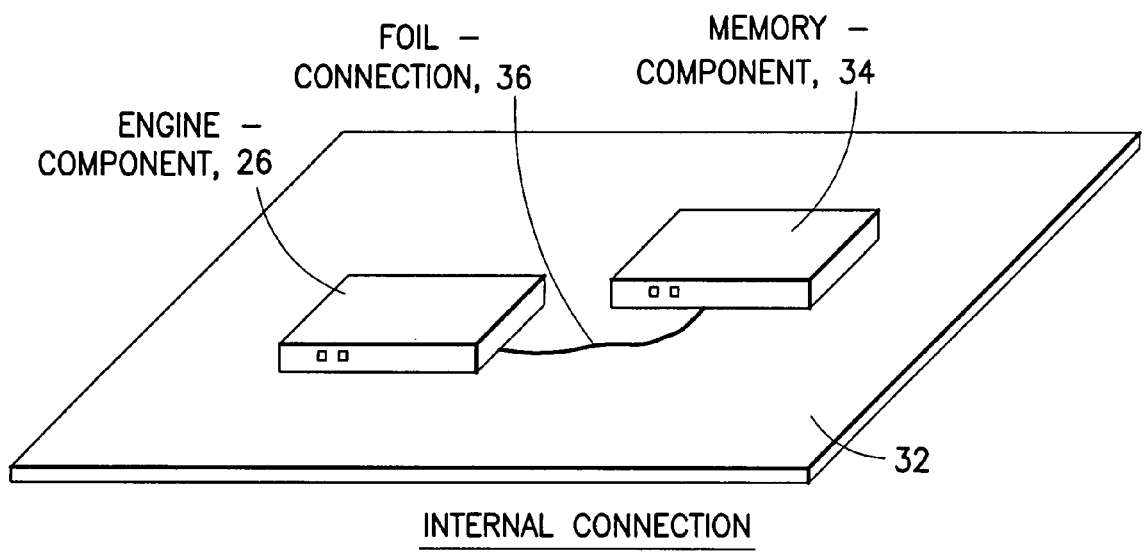
FIG. 3 is a perspective view of some of the components of the device shown in FIG. 1.

As illustrated generally by the input, output and input/output lines shown in FIG. 2, the electronic device of the device 10 noted above are electrically connected by suitable wire conductors, wire cables and/or conductor traces on printed wiring board(s). The different electronic devices are connected together internally inside the housing 30 of the device 10. For example, FIG. 3 shows the printed wiring board 32 of the device 10 with the engine 26 connected to the memory 34 by a foil or conductor trace 36. Other ones of the electronic devices could be connected with conductor traces as well.

Figure 4:
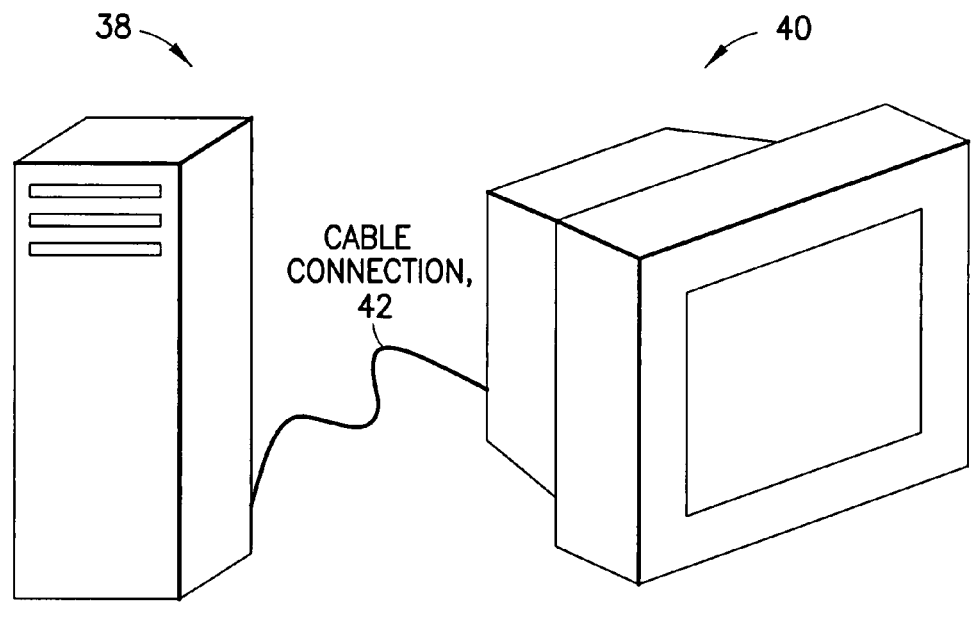
FIG. 4 is an perspective view of another embodiment of the invention.

Electrical connection of electronic devices is not limited to electronic devices inside a single device. For example, as shown in FIG. 4, a first electronic device 38 can be connected to a second electronic device 40 by a detachable cable 42. In this example, the first electronic device 38 is a computer, which acts as an engine, and the second electronic device 40 is a monitor, which acts as a slave. However, any suitable separate electronic devices could be connected. For the device 10 shown in FIGS. 1-3, the electrical connector 28 allows the device 10 to be connected to an external or auxiliary separate second electronic device.

Figure 5:
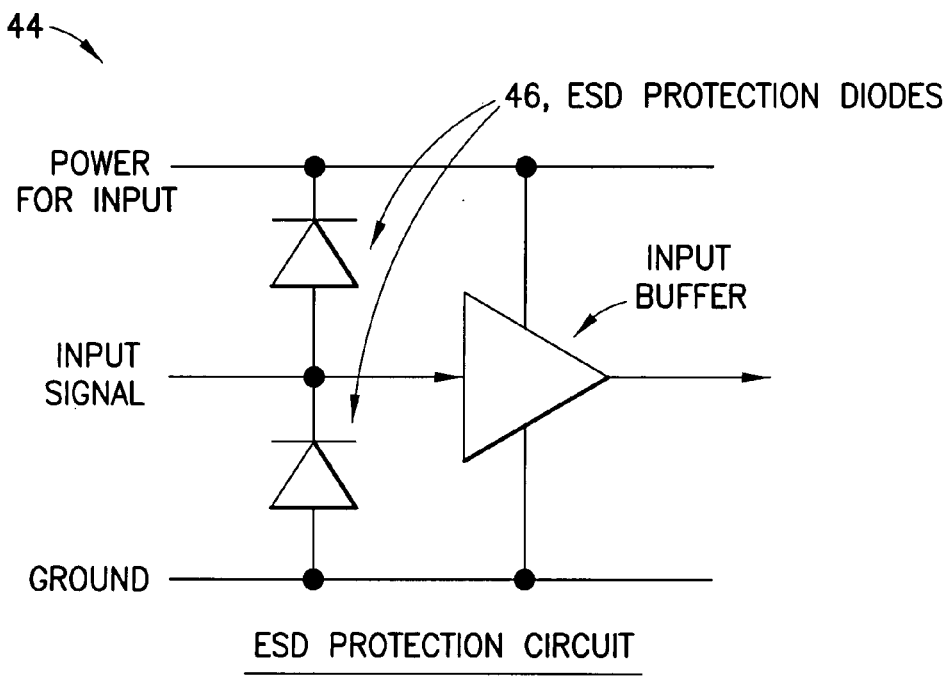
FIG. 5 is a circuit diagram of a conventional electrostatic discharge (ESD) protection circuit.

Electrical components can communicate different signal types between each others. For analog signals different voltage levels can have a different meaning. For digital signals, different voltage level steps can have a different meaning. As noted above, inputs into an electrical component can be protected against electrostatic discharge by an ESD protection circuit. An example of an ESD protection circuit 44 is shown in FIG. 5. The common solution is the use of diodes 46 in the ESD protection circuit 44.

Figure 6:
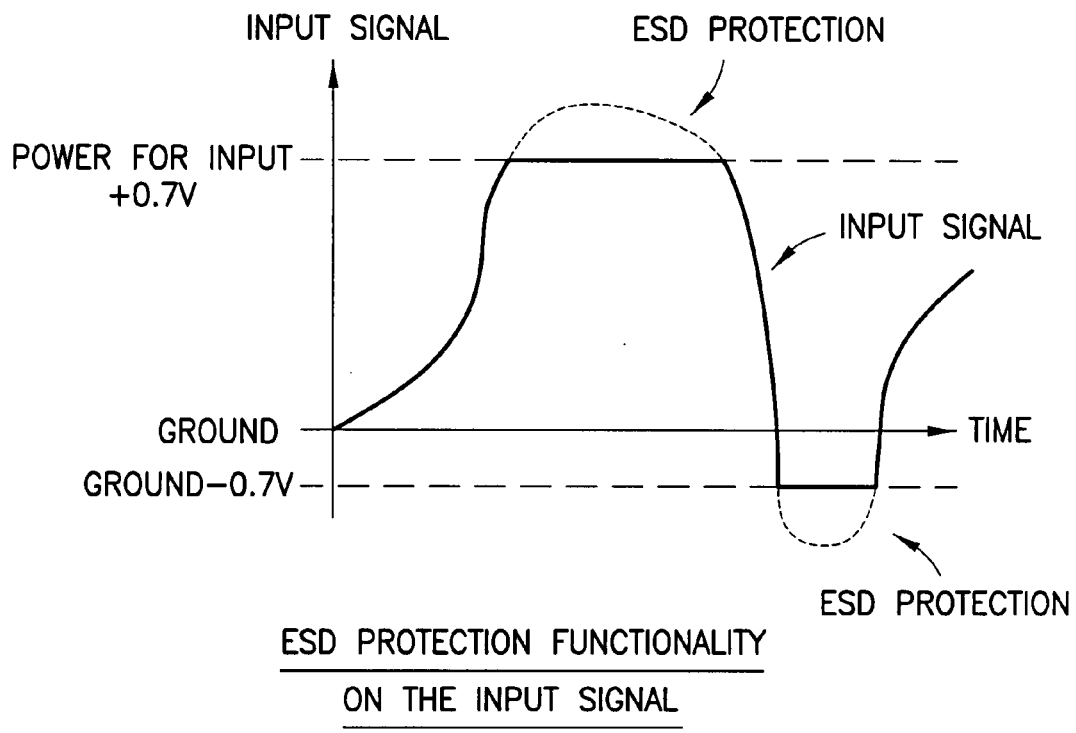
FIG. 6 is a chart showing an example of protection provided by an ESD protection circuit.

As seen with reference to FIG. 6, if the input voltage is greater than the power of the input of the component, and there is a voltage drop over one of the diodes 46, such as 0.7V for example, then the input voltage is limited to "Power for Input +0.7V". If the input voltage is less than ground of the input of the component, and there is a voltage drop over the other one of the diodes 46, such as 0.7V for example, than the input voltage is limited to "Ground −0.7V".

Figure 7:
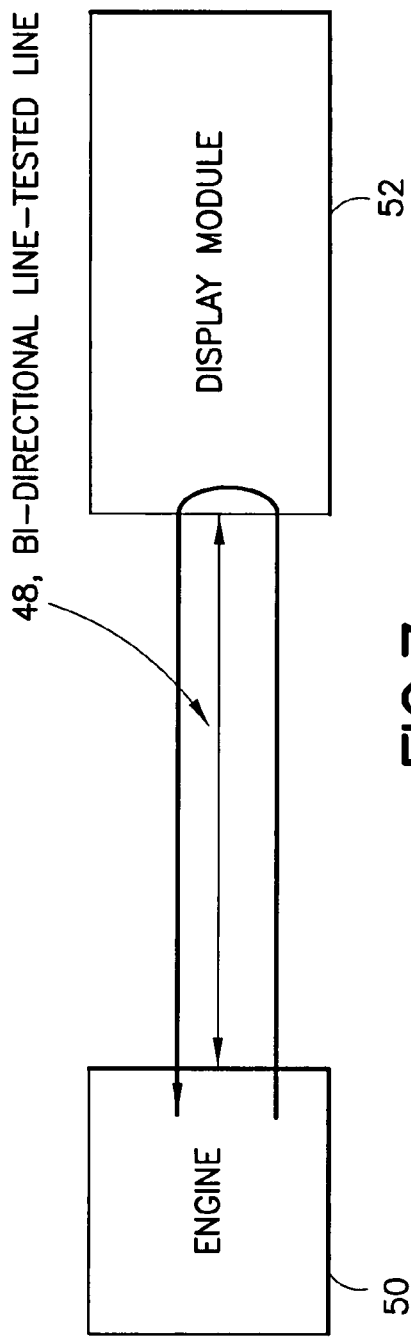
FIG. 7 is a diagram illustrating bi-directional line testing.
Figure 8:
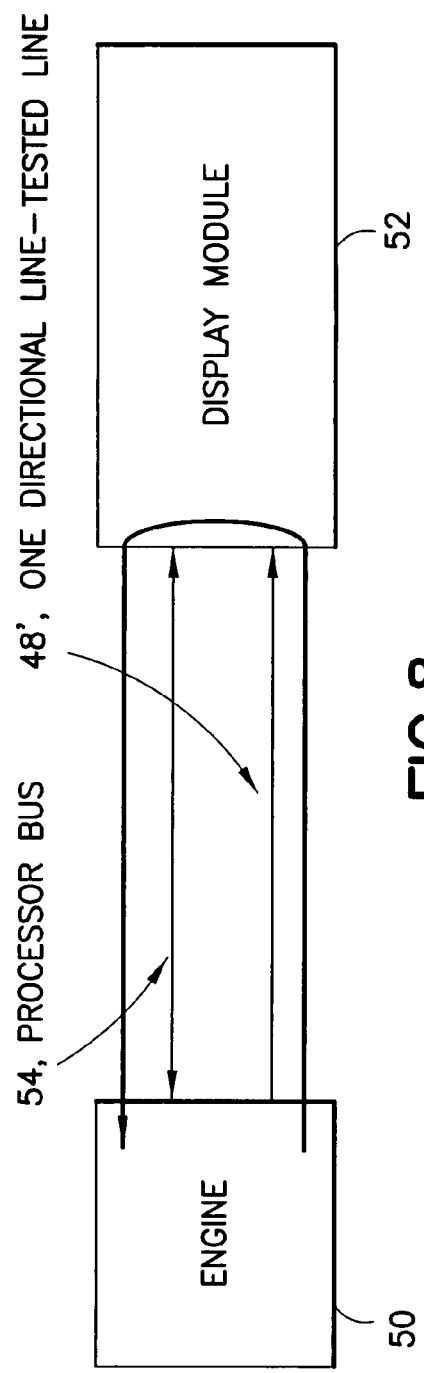
FIG. 8 is a diagram illustrating one directional line testing.

A line connection test can be done between components inside a device or between separate devices to insure that the devices/components are working properly and do not need to be serviced, such as having a user send the device away for service. This line connection test can be done different ways. FIGS. 7 and 8 show examples for inside the device 10. As seen in FIG. 7, if the signal line 48 (such as line 36 in FIG. 3) is bidirectional, the first component/device 50 (such as engine 26 in FIGS. 2 and 3 for example) can send information to the second component/device 52 (such as one of the slave devices 12-24 in FIG. 2, or 40 in FIG. 4). The first electronic device 50 can read this sent information from the second electronic device 52 via the same line 48. As illustrated in FIG. 8, if the signal line 48' is one directional, the first electronic device 50 can send information the second electronic device 52, and the first electronic device 50 can read this sent information from the second electronic device 52 via a bus 54, such as a processor bus, which is parallel with one directional line 48'. FIG. 2 shows examples of various inputs and outputs on lines between the engine 26 and the other components of the device 10.

Referring to FIG. 7, a line connection test needs some kind of logic on the slave device 52 when bi-directional communication is used on the same line. Referring to FIG. 8, a line connection test using a one directional line needs some kind of logic on the slave device, and a parallel bus between the engine and the slave device to get this information. In conventional devices, this meant that several different line testing solutions were needed to test a single line connection. However, with the present invention, for any line into an input having an ESD protection circuit every line connection (analog, digital, etc.—Input or Input/Output) can be tested in the same way.

With the invention, the first electronic device (such as the engine 26) can be used to output an excessive voltage level to the second electronic device. This can automatically activate the ESD protection circuit at the input to the second electronic device (the slave component or device), on the line; the ESD protection circuit being connected between the engine and the slave. The excessive voltage level is merely a voltage which is greater than the maximum voltage level of the ESD protection circuit, such as "Power +0.7V" on the example noted above.

Figure 9:
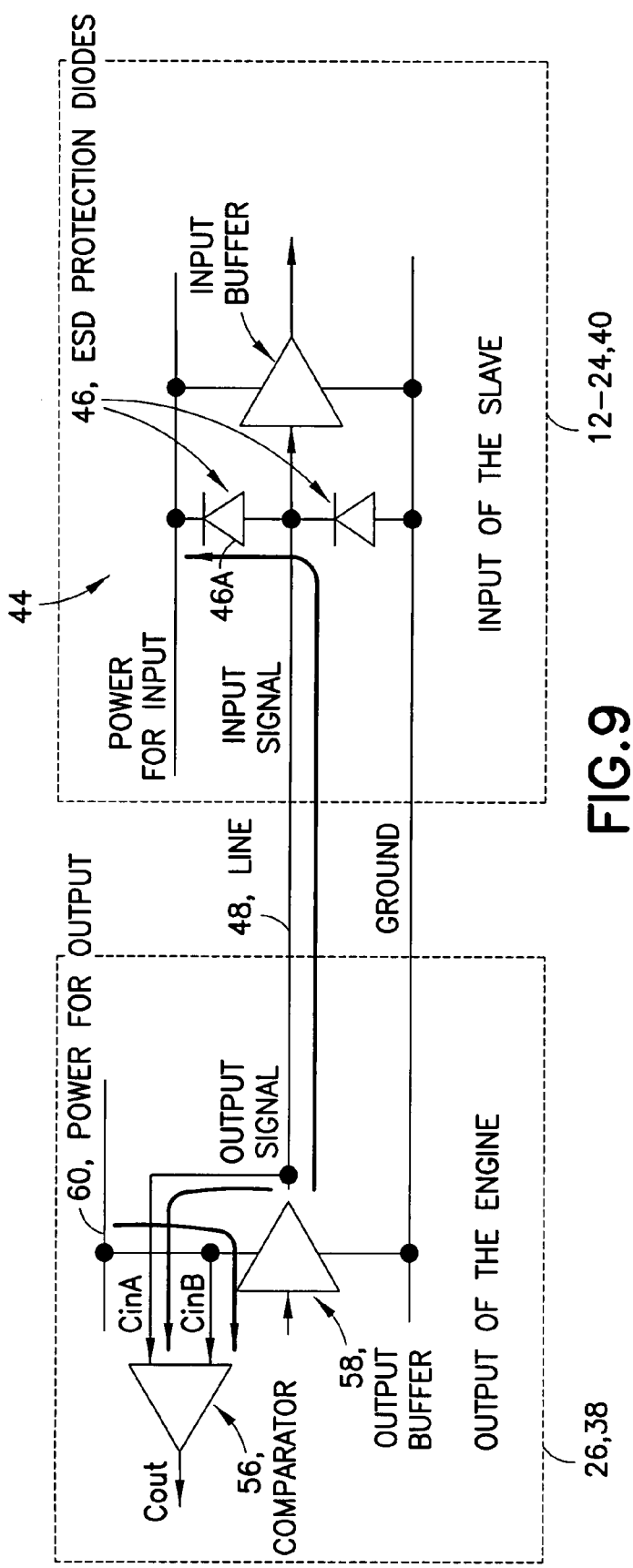
FIG. 9 is a circuit diagram illustrating features of the invention.

Referring also to FIG. 9, the first electronic device comprises the engine 26. The engine 26 comprises a comparator 56 and a signal buffer 58. The signal buffer is a signal driver which outputs the output signal. In an alternate embodiment, any device that can drive the load circuit can be used instead of the signal buffer 58. For example, it might be a buffer, an inventor, or a logic gate(s). The output signal can be an analog signal, such as output from a Digital-Analog Converter (DAC). For example, the DAC can be used to output analog signals from a VGA connector of a computer to a display monitor (such as red, green and blue analog signals). In the embodiment shown, the buffer 58 is connected to the power for output 60. The comparator 56 has a first input CinB connected to the power for output 60. The comparator 56 also has a second input CinA which is connected to the line 48

(such as line 36 in FIG. 3 or 42 in FIG. 4 for example). The engine 26 can read the voltage level of the line 48 by use of the comparator 56.

If the outputted voltage on the line 48 is clipped by the input ESD protection circuit 44 at the slave 40, the connection between the two components 38, 40 exists. As shown in FIGS. 11-12, if the outputted voltage is not clipped by the input ESD protection circuit 44, the connection between the two components 38, 40 does not exist.

Figure 10:
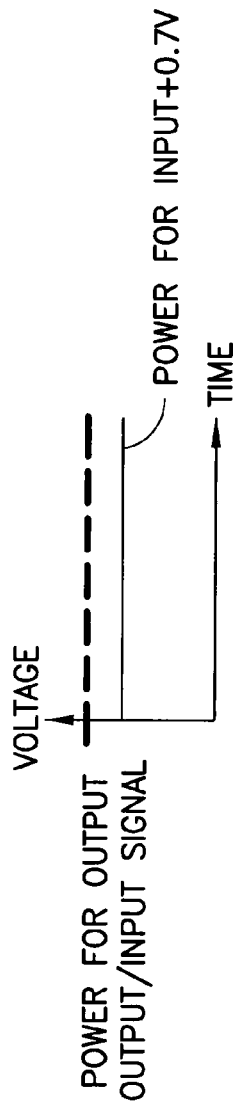
FIG. 10 is a chart showing voltage differences of power for output and output signal for the embodiment shown in FIG. 9.

In the embodiment shown in FIGS. 9-10, the engine 26 is connected to the slave 40 via a one-directional line 48. The output signal of the output buffer 58 of the engine is connected to the line 48 and the second input (CinA) of the comparator 56. The second input (CinB) of the comparator 56 is connected to "Power for Output" 60. The "Power for Output" 60 is higher (more than 0.7V; e.g. 1.0V) than the "Power for Input". The output signal of the output buffer presents a logic "1", which voltage level is as same as the "power for output".

With the line 48 connected to an input of the slave, the ESD protection diode 46A is clipping 0.3V (=1.0V−0.7V) away from the output signal of the output buffer 58. With the line 48 connected, the output signal of the output buffer 58 is the input signal on the line 48. This means that the voltage level of the second comparator input CinA is lower than the first comparator input CinB. This cause the output level (Cout) of the comparator 56 to change and the engine 26 knows that the slave is connected on the line 48.

With the line 48 not connected to an input of the slave, as shown in FIG. 11, the ESD protection diode 46A is not clipping any voltage away from the output signal of the output buffer 58. This means that the voltage level of the second comparator input CinA is the same as the voltage level at the first comparator input CinB. The output level Cout of the comparator 56 has not been changed and the engine 26 knows that the input of the slave is not connected on the line 48.

The present invention is, thus, able to perform a line connection test by use of the ESD protection circuit of the slave. Every line connection (analog, digital, etc.—Input or Input/Output) can be tested in the same way for all inputs which include an ESD protection circuit. The engine can use an excessive voltage level, which makes it possible to activate the ESD protection diode(s) at the input of the slave (component or device), on the line. The engine can read the voltage level of the line (such as with a comparator in the example described above). In alternate embodiments, other suitable means could be used to determine if the voltage has been clipped or not clipped by the ESD protection circuit. If the outputted voltage of the output signal is clipped by the input ESD protection circuit of the slave, the line connection is OK. If the outputted voltage of the output signal is not clipped by the input ESD protection circuit of the slave, the line connection is not OK.

The invention has various advantages. Only one line connection testing solution is needed versus several different solutions currently used in conventional systems. The invention can be used with all suitable signal line types. It is possible to implement the invention with both internal line connections and external line connections. Thus, an internal line connection between first and second electronic devices inside the device 10 can be provided with the invention. Additionally, or alternatively, an external line connection between first and second electronic devices, such as between the device 10 and another separate device, can be provided with the invention. The ESD protection circuit(s) can, thus, be provided inside the device 10 and/or in the separate device which the device 10 is connected to.

Figure 13:
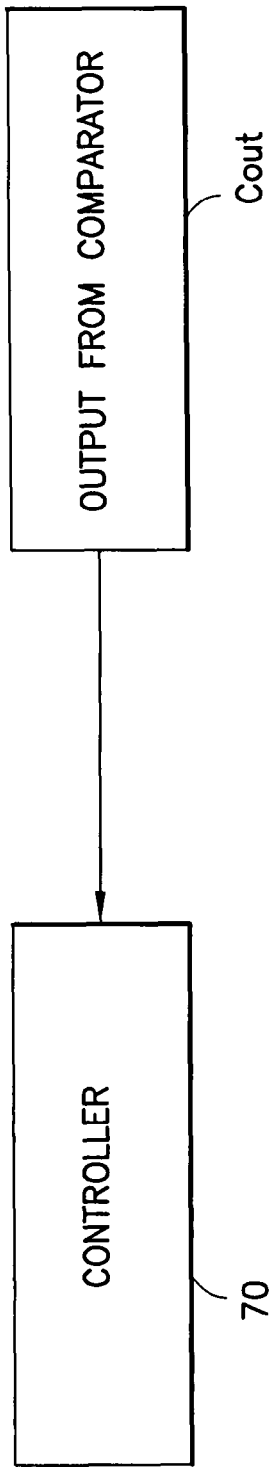
FIG. 13 is a diagram illustrating transmission of the output from the comparator to a controller.
Figure 14:
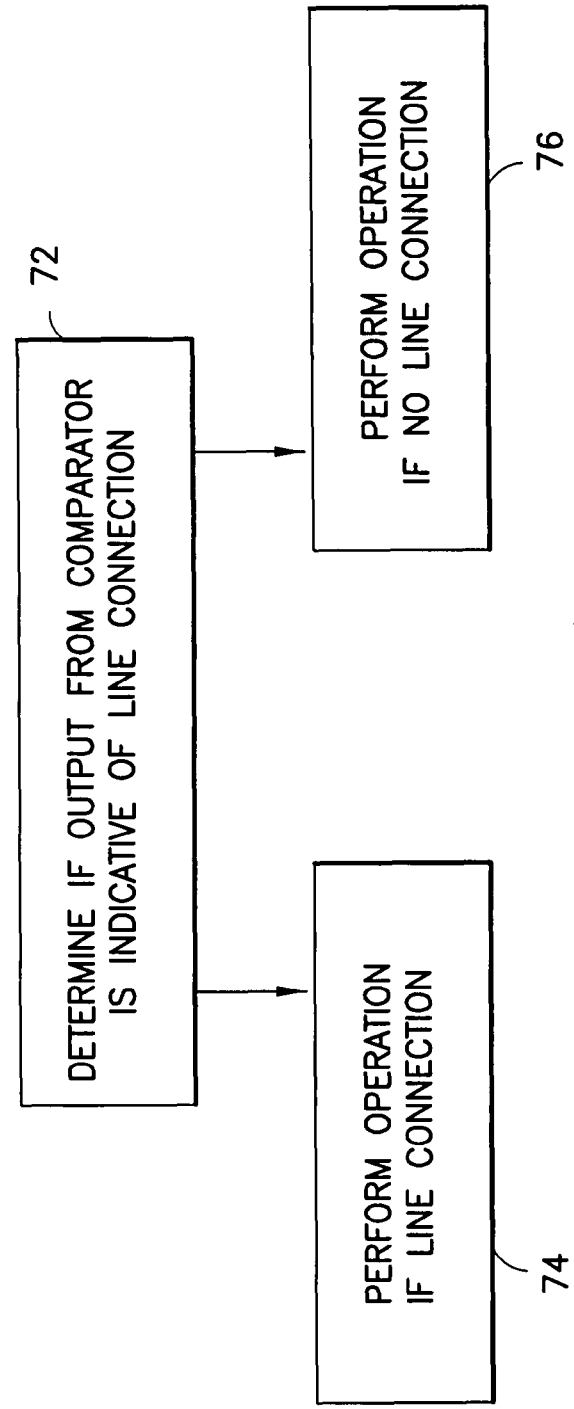
FIG. 14 is a flow chart illustrating possible actions by the controller.

Referring also to FIG. 13, the output from the comparator Cout is sent to a controller 70. The controller 70 may be the microprocessor of the engine. The controller 70 is adapted to perform a task or operation based upon the output Cout from the comparator. Referring also to FIG. 14, as indicated by block 72, the controller 70 is adapted to determine if the output from the comparator is indicative of whether or not a line connection exists. As indicated by block 74, the device 10 can perform an operation if the line connection exists. Additionally, or alternatively, as indicated by block 76, the device 10 can perform an operation if the line connection does not exist. The operation could be any suitable type of operation, such as a software operation, such as displaying a message on the display 22, generating an audio signal from the speaker 20, and/or activating a software application for example. These are only some examples.

In alternate embodiments, the ESD protection circuit might not comprise a diode, or could be different from the two diode ESD protection circuit shown in the figures. For example, an ESD protection circuit could comprise transistor (s) or some other active devices. Thus, the invention is intended to include these alternatives.

It should be understood that the foregoing description is only illustrative of the invention. Various alternatives and modifications can be devised by those skilled in the art without departing from the invention. For example, features recited in the various dependent claims could be combined with each other in any suitable combination(s). Accordingly, the invention is intended to embrace all such alternatives, modifications and variances which fall within the scope of the appended claims.

What is claimed is:

1. An electrical connection testing system for testing existence of an electrical connection between a first electronic device and a second electronic device, wherein an electrostatic discharge (ESD) protection circuit is adapted to be provided between the first and second electronic devices, the testing system comprising:
   a comparator having a first input connected to a power for output of the first electronic device and a second input connected to an output signal from the first electronic device, wherein the output signal is adapted to be sent to the second electronic device through the electrostatic discharge protection circuit; and
   a system for determining if a comparator output from the comparator is indicative of the first and second inputs being different or if the comparator output is indicative of the first and second inputs being substantially the same.

2. An electrical connection testing system as in claim 1 wherein the first electronic device comprises a signal driver which outputs the output signal and is connected to the power for output.

3. An electrical connection testing system as in claim 1 wherein the system for determining is adapted to determine if an output level of the comparator output changes.

4. An electrical connection testing system as in claim 1 wherein the first and second electronic devices are on a common printed wiring board and connected to each other by a conductor.

5. An electrical connection testing system as in claim 1 wherein the first and second electronic devices are connected to each other by a disconnectable electrical cable which forms an electrical conductor for transmitting the output signal from the first electronic device to the electrostatic discharge protection circuit at the second electronic device.

6. An electrical connection testing system as in claim 5 wherein the cable has a plurality of electrical conductors and the testing system is adapted to test connection of each of the conductors between the first and second electronic devices the same way, individually.

7. An electrical connection testing system as in claim 1 wherein the testing system comprises a controller for performing an operation based upon the comparator output from the comparator.

8. An electrical connection testing system as in claim 1 further comprising a system for providing the power for output as a test voltage which is larger than a maximum voltage of the electrostatic discharge protection circuit.

9. A hand-held portable electronic device comprising:
an electrical connector for removably connecting the hand-held portable electronic device to a second electronic device, wherein the electrical connector comprises electrical terminals; and
a testing system as in claim 1 in the hand-held portable electronic device, wherein the hand-held portable electronic device form the first electronic device, and wherein the second input of the comparator is electrically connected to one of the electrical terminals.

10. An electronic device assembly comprising:
a hand-held portable electronic device as in claim 9; and
a second electronic device electrically connected to the hand-held portable electronic device by a removable cable, wherein the second electronic device has a plurality of input signal lines each having a separate electrostatic discharge protection circuit, and wherein the hand-held portable electronic device has a plurality of the comparators each connected to a separate one of the electrical terminals.

11. An apparatus comprising:
a first electronic device forming an engine;
a second electronic device forming a slave;
an electrical conductor connecting the first electronic device to the second electronic device;
an electrostatic discharge (ESD) protection circuit comprising a diode connected between the conductor and the second electronic device;
a comparator having a first input connected to a power for output of the first electronic device and a second input connected to an output signal from the first electronic device to the conductor; and
a system for determining if the first and second electrical devices are connected to each other by the conductor based upon a comparator output of the comparator.

12. An apparatus as in claim 11 wherein the first and second electronic devices are located in a common housing, and wherein the electrical conductor is a conductor trace on a printed wiring board.

13. An apparatus as in claim 11 wherein the first and second electronic devices are located in separate housings and the electrical conductor is in a disconnectable cable connected between the housings.

14. An apparatus as in claim 11 wherein the system for determining is adapted to determine if the comparator output changes.

15. An apparatus as in claim 11 further comprising a controller adapted to perform an operation when the system for determining determines if the first and second electronic devices initially connected to each other or disconnected from each other.

16. An apparatus as in claim 11 wherein the comparator is adapted to compare a voltage of the output signal to a voltage of the power for output of the first electronic device.

17. An apparatus as in claim 16 wherein the first electronic device comprises a signal buffer connected to the power for output, wherein the signal buffer outputs the output signal to the second electronic device through the electrostatic discharge protection circuit and the electrical conductor.

18. An apparatus as in claim 17 wherein the electrostatic discharge protection circuit is adapted to limit the voltage of the output signal to a value less than the power for output.

19. An apparatus as in claim 11 wherein the first electronic device comprises a system for providing the power for output with a test voltage which is greater than a maximum voltage of the electrostatic discharge protection circuit.

20. An apparatus as in claim 11 further comprising means for performing an operation by the first electronic device if the system for determining determines a change in a level of the comparator output.

21. A method comprising:
sending an output signal powered by a power for output at an excessive voltage from a first electronic device to a second electronic device, wherein an electrostatic discharge (ESD) protection circuit is provided at the second electronic device, wherein the excessive voltage of the power for output is larger than a maximum voltage of the electrostatic discharge protection circuit, and wherein the electrostatic discharge protection circuit prevents voltage of the output signal from exceeding the maximum voltage of the electrostatic discharge protection circuit; and
comparing the voltage of the output signal of the first electronic device to the excessive voltage of the power for output of the first electronic device to determine if the first and second electronic devices are electrically connected to each other through the electrostatic discharge protection circuit.

22. A program storage device readable by a machine, tangibly embodying a program of instructions executable by the machine for performing operations to test an electrical connection between a first electronic device and a second electronic device, the operations comprising:
based upon a comparison of voltage of an output signal, from the first electronic device to the second electronic device, to a voltage of a power for output of the first electronic device, determining if the first and second electronic devices are electrically connected to each other through an electrostatic discharge protection circuit; and
performing an operation if the step of determining determines that the first and second electronic devices are not electrically connected to each other through the electrostatic discharge protection circuit.

* * * * *